United States Patent
Shimoji et al.

(10) Patent No.: US 6,570,086 B1
(45) Date of Patent: May 27, 2003

(54) COOLING STRUCTURE OF COMMUNICATION DEVICE

(75) Inventors: Mihoko Shimoji, Tokyo (JP); Eiichi Ozaki, Tokyo (JP); Kazushige Nakao, Tokyo (JP); Tetsurou Ogushi, Tokyo (JP); Koichi Hirao, Tokyo (JP); Manabu Hasegawa, Tokyo (JP); Takashi Kobayashi, Tokyo (JP); Jiro Yoshizawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/048,924

(22) PCT Filed: Jun. 6, 2000

(86) PCT No.: PCT/JP00/03655
§ 371 (c)(1),
(2), (4) Date: Feb. 5, 2002

(87) PCT Pub. No.: WO01/95687
PCT Pub. Date: Dec. 13, 2001

(51) Int. Cl.⁷ ................................................. H05K 9/00
(52) U.S. Cl. ...................... 174/35 R; 361/816; 361/719
(58) Field of Search ..................... 174/35 R, 35 MS; 361/816, 818, 719; 257/712, 713, 707

(56) References Cited

U.S. PATENT DOCUMENTS 5,801,330 A 9/1998 Gademann et al.
6,049,469 A * 4/2000 Hood, III et al. ............ 361/818
6,053,771 A * 4/2000 Hood, III et al. ............ 439/607

FOREIGN PATENT DOCUMENTS

| JP | 62-23491 | 2/1987 |
|---|---|---|
| JP | 63-124598 | 5/1988 |
| JP | 63-153924 | 6/1988 |
| JP | 3-8496 | 1/1991 |
| JP | 3-257997 | 11/1991 |
| JP | 4-46591 | 4/1992 |
| JP | 4-51192 | 4/1992 |
| JP | 7-30280 | 1/1995 |
| JP | 7-226466 | 8/1995 |
| JP | 10-41678 | 2/1998 |
| JP | 10-256764 | 9/1998 |
| JP | 11-204970 | 7/1999 |

* cited by examiner

Primary Examiner—Hung V. Ngo
(74) Attorney, Agent, or Firm—Leydig, Voit & Mayer, Ltd.

(57) ABSTRACT

A communication device includes a communication circuit mounted on a printed substrate and having a heat generating element; a shield casing covering the communication circuit and shielding electromagnetic waves; a housing accommodating the shield casing and the printed substrate; a heat diffusing member mounted along an inner wall of the shield casing diffusing heat in a planar direction; and a heat insulating layer disposed between the shield casing and an inner wall of the housing.

7 Claims, 11 Drawing Sheets

| | Heat Diffusing Sheet on Shield Casing | Heat Conductive Sheet on Air Layer | Heat Diffusing Sheet on Housing |
|---|---|---|---|
| Embodiment 1 | O | O | |
| Embodiment 2 | O | | |
| Embodiment 6 | O | O | O |

COOLING STRUCTURE OF COMMUNICATION DEVICE

FIELD OF THE INVENTION

The present invention generally relates to a communication device and, more particularly, to a heat radiating structure for dissipating heat from a pyrogenic element enclosed within a housing.

BACKGROUND ART

Figure 17:
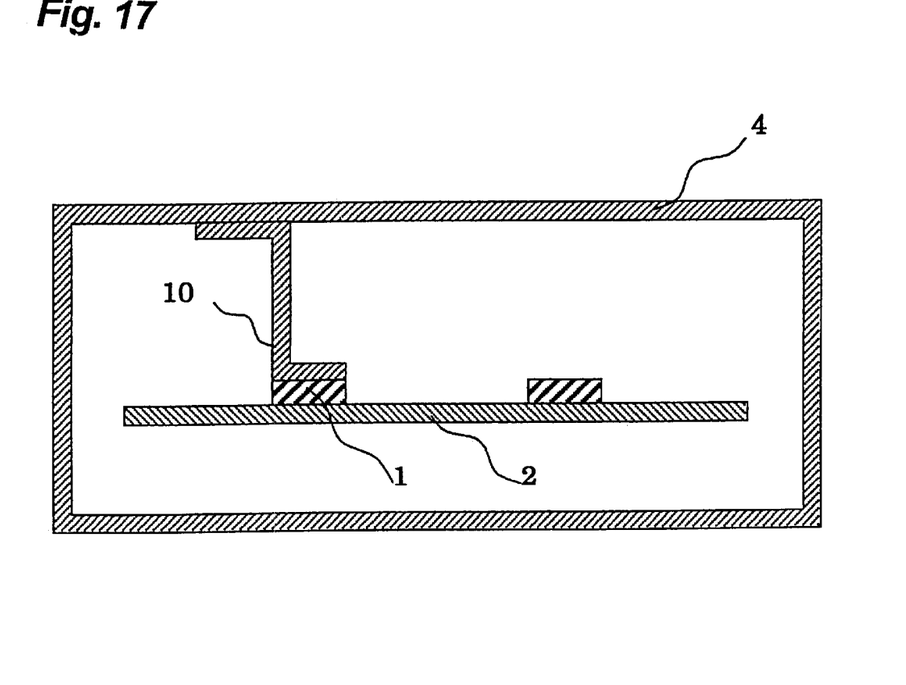
FIG. 17 is a sectioned structural diagram showing an important structure of the conventional electronic equipment having a heat radiating function.

In conventional electronic devices such as mobile communication devices, there is such a mobile communication device including a heat radiating structure for dissipating heat generated from a built-in pyrogenic element as shown in FIG. 17. FIG. 17 illustrates a sectioned structural diagram showing an important structure of the conventional mobile communication device disclosed in the Japanese Laid-open Patent Publication No. 11-204970. In this figure, reference numeral 1 represents a heat generating element (hereinafter referred to as a pyrogenic element), reference numeral 2 represents a printed substrate on which a communication circuitry including the pyrogenic element 1 is mounted, reference numeral 4 represents a housing for accommodating the printed substrate, and reference numeral 10 represents a heat radiating plate.

The air has a low thermal conductivity, say, 0.026 W/mK and, accordingly, where a air layer exits between the pyrogenic element 1 and the housing 4, thermal resistance between the pyrogenic element 1 and the housing 4 is high, the temperature difference is large, and there is a problem that the pyrogenic element 1 tends to be heated to a high temperature. For this reason, a heat radiating plate 10 made of aluminum (having a thermal conductivity of 230 W/mK) or carbon (having a thermal conductivity of 500 to 800 W/mK) has one end held in tight contact with the pyrogenic element 1, and the opposite end mounted to the inner wall of the housing 4 that is low in temperature.

With the above construction, the thermal resistance from the pyrogenic element 1 to the housing 4 is reduced and the element temperature can be lowered.

However, thermal limiting conditions of the mobile communication device include not only lowering of the element temperature, but also there is a thermal limiting condition between the element temperature and the housing temperature. By way of example, in the case of a personal computer there is no problem even if the temperature of the bottom becomes high, but the mobile telephone has to have the housing temperature limited since the instrument is often brought into contact with the user's hand and face.

With the heat radiating structure shown in FIG. 17, there is a problem that since the heat liberated from the pyrogenic element 1 is locally conducted to the housing 4 to which that end of the heat radiating plate 10 is mounted, a surface temperature of the housing 4 tends to become locally high.

Figure 18:
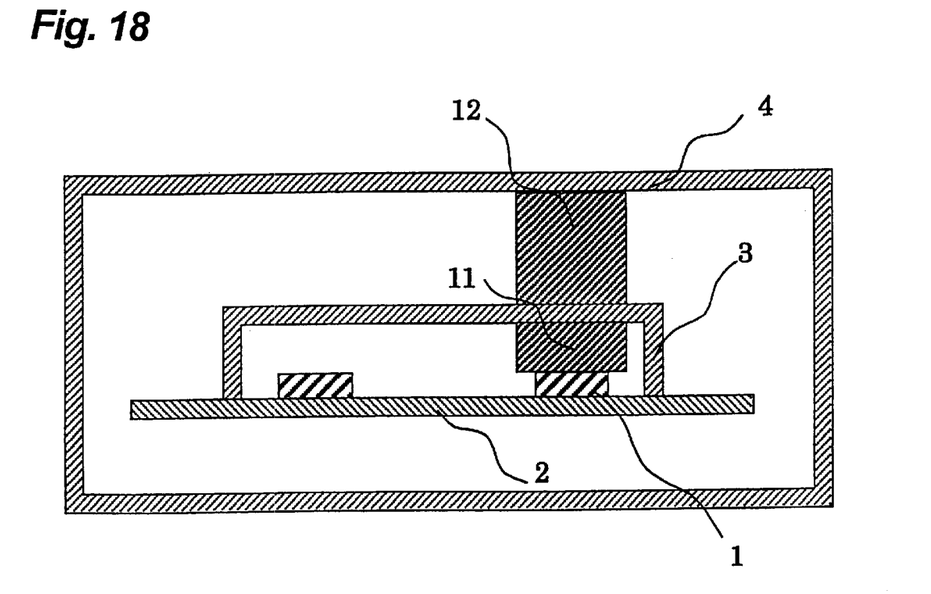
FIG. 18 is a sectioned structural diagram showing an important structure of the different conventional electronic equipment having a heat radiating function.

FIG. 18 illustrates a sectioned structural diagram showing an important structure of another electronic equipment (an optical receiver) having a heat radiating function disclosed in the Japanese Laid-open Patent Publication No. 10-41678. In this figure, reference numeral 1 represents a heat generating circuit element (hereinafter referred to as a pyrogenic element) such as an amplifying circuit, a demodulating circuit or the like, reference numeral 2 represents a printed substrate on which the pyrogenic element 1 is mounted, reference numeral 3 represents a shield casing for shielding the pyrogenic element 1, reference numeral 4 represents a housing, reference numerals 11 and 12 represent respective heat conductive sheets (having a thermal conductivity of 1 W/mK) of a silicone system or the like disposed in an air layer between the pyrogenic element 1 and the shield casing 3 and in an air layer between the shield casing 3 and the housing 4.

Even in such construction, although as is the case with the previously described prior art, the thermal resistance between the pyrogenic element 1 and the housing 4 becomes low, the temperature difference becomes small and the element temperature can therefore be lowered, there is a problem that the surface temperature of the housing tends to be locally high since heat liberated from the element is locally conducted to an inner wall of the housing 4 to which one end of the heat conductive sheet 12 is mounted.

Figure 19:
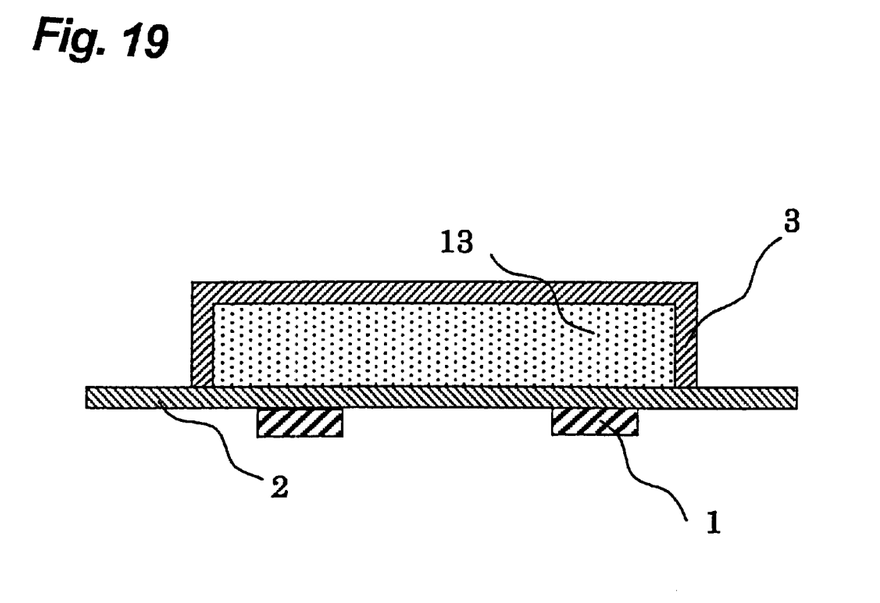
FIG. 19 is a sectioned structural diagram showing an important structure of the further different conventional electronic equipment having a heat radiating function.

FIG. 19 illustrates a sectioned structural diagram showing an important structure of another electronic equipment having a heat radiating function disclosed in the Japanese Laid-open Patent Publication No. 63-124598. In this figure, reference numeral 1 represents an integrated circuit which is a heat generating circuit element (hereinafter referred to as a pyrogenic element). Reference numeral 2 represents a printed substrate on which the pyrogenic element 1 is mounted, reference numeral 3 represents a shield casing provided on an undersurface of the print substrate 2 for shielding the printed substrate 2, and reference numeral 13 represents a thermally conductive insulating body filled between the undersurface of the printed substrate 2 and the shield casing 3.

Although even in such construction heat liberated from the pyrogenic element 1 can be radiated, since in this prior art, the thermally conductive electrically insulating body 13 is mounted through the printed substrate, the temperature increase of an element of a thermal resistance component of the printed substrate cannot be reduced. Also, since for the thermally conductive electrically insulating body 13, a thermally conductive material having a thermal conductivity that is relatively low as compared with that of a metallic material such as aluminum or the like ($\frac{1}{100}$ to $\frac{1}{200}$ of the thermal conductivity of aluminum) is employed, a relatively large volume of the thermally conductive material is needed to sufficiently dissipate the heat, resulting in the electronic equipment that is heavy.

Figure 20:
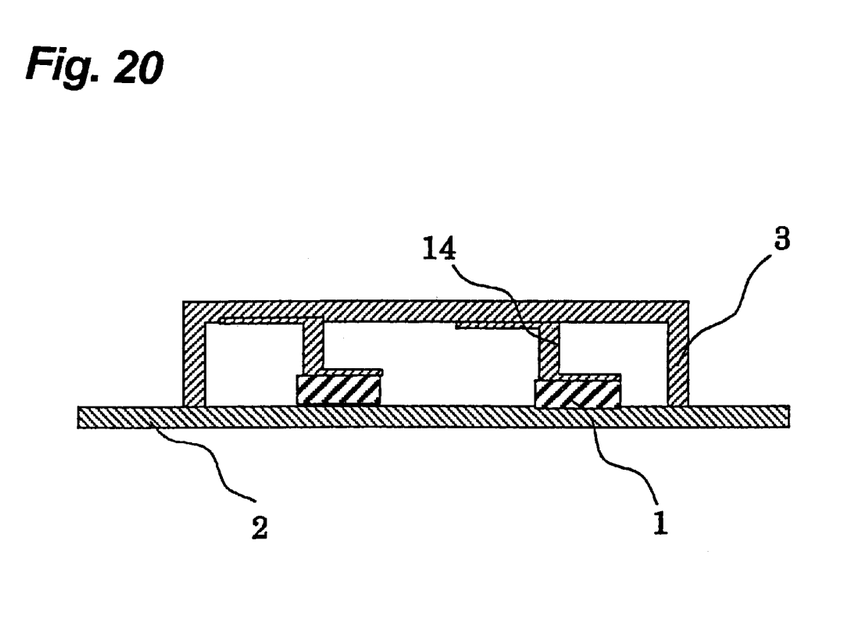
FIG. 20 is a sectioned structural diagram showing an important structure of the still different conventional electronic equipment having a heat radiating function.

FIG. 20 illustrates a sectioned structural diagram showing an important structure of another electronic equipment (a printed circuit board device) having a heat radiating function disclosed in the Japanese Laid-open Utility Model Publication No. 3-8496. In this figure, reference numeral 1 represents a semiconductor component which is a heat generating circuit element (hereinafter referred to as a pyrogenic element). Reference numeral 2 represents a printed circuit board on which the pyrogenic element 1 is mounted, and reference numeral 3 represents a shielding plate fitted to the printed circuit board 2 for electromagnetically shielding it from other printed circuit boards. Reference numeral 14 represents an L-shaped metal piece provided between the pyrogenic element 1 and the shielding plate 3.

Although even in such construction heat liberated from the pyrogenic element 1 can be radiated through the shielding plate 3, there is a problem in this prior art that since the metallic material is mounted in the vicinity of the semiconductor component, no electric characteristic can be warranted and the L-shaped metal piece is unable to diffuse heat sufficiently within a plane of the shielding plate 3.

The present invention has been aimed at solving the above discussed problems and has its object to provide a communication device in which the temperature of the pyrogenic element is reduced efficiently and the surface temperature of the housing can be lowered.

DISCLOSURE OF THE INVENTION

A first communication device according to the present invention includes a communication circuit mounted on a printed substrate and having a heat generating element; a shield casing covering the communication circuit and shielding electromagnetic waves; a housing for accommodating the printed substrate having the shield casing and the communication circuit mounted thereon; a heat diffusing member mounted along an inner wall of the shield casing for diffusing heat in a planar direction; and a heat insulating layer disposed between the shield casing and an inner wall of the housing. According to this, local increase of the temperature of the housing to a high temperature can be suppressed and, also, the temperature of the pyrogenic element can be efficiently lowered.

A second communication device according to the present invention includes, in the above described first communication device, a electrically insulating, thermally conductive member disposed between the heat diffusing member and the heat generating element. According to this, not only can the electric characteristic warranted, but also a high cooling effect can be obtained even though a small volume of heat conductive member is inserted, resulting in efficient lowering of the temperature of the pyrogenic element.

A third communication device according to the present invention includes a communication circuit mounted on a printed substrate and having a heat generating element; a metal type shield casing covering the communication circuit and shielding electromagnetic waves; an electrically insulating, thermally conductive member disposed between the metal type shield casing and the heat generating element; a housing for accommodating the printed substrate having the shield casing and the communication circuit mounted thereon; a heat insulating layer disposed between the shield casing and an inner wall of the housing. According to this, local increase of the temperature of the housing to a high temperature can be suppressed and, also, the temperature of the pyrogenic element can be efficiently lowered.

A fourth communication device according to the present invention includes a communication circuit mounted on a printed substrate and having a heat generating element; a shield casing covering the communication circuit and shielding electromagnetic waves; a housing for accommodating the printed substrate having the shield casing and the communication circuit mounted thereon; a heat diffusing member mounted along an outwall of the shield casing for diffusing heat in a planar direction; and a heat insulating layer disposed between the heat diffusing member and an inner wall of the housing. According to this, local increase of the temperature of the housing to a high temperature can be suppressed and, also, the temperature of the pyrogenic element can be efficiently lowered. Also, since a large mounting area for the heat diffusing member can be secured, it is particularly effective for lowering the housing temperature.

A fifth communication device according to the present invention includes, in the fourth communication device, an electrically insulating, thermally conductive member disposed between an inner wall of the shield casing and the heat generating element. According to this, not only can the electric characteristic warranted, but also a high cooling effect can be obtained even though a small volume of heat conductive member is inserted, resulting in efficient lowering of the temperature of the pyrogenic element.

Sixth to eighth communication devices according to the present invention are such that in any of the first, third and fourth communication devices, a heat diffusing member for diffusing heat in a planar direction is mounted on an inner or outer wall of the housing. According to this, the housing temperature can be equalized further and lowering of the housing temperature is possible.

Ninth to eleventh communication devices according to the present invention are such that in any of the sixth to eighth communication devices, the heat diffusing member provided on the housing inner wall is of a shape in which a portion thereof confronting the heat generating element within the shield casing or a portion thereof confronting a component provided externally on the shield casing protrudes towards the shield casing. According to this, there is an effect that the housing will not be heated partially.

Twelfth to fourteenth communication device according to the present invention are such that in any one of the first, third and fourth communication devices, a heat equalizing member is provided on an outer wall of the shield casing excluding a location where a component provided externally of the shield casing, or an inner wall of the housing excluding an inner wall portion of the housing confronting the above described component. According to this, there is an effect that the housing will not be heated partially.

Fifteenth to seventeenth communication devices according to the present invention are such that in any of the first, third and fourth communication devices, the housing is of a shape wherein a portion thereof confronting the heat generating element within the shield casing, or a portion thereof confronting a component provided externally of the shield casing protrudes outwardly. According to this, there is an effect that the housing will not be heated partially.

Eighteenth to twentieth communication devices according to the present invention are such that in any one of the first, third and fourth communication devices, the housing is of a shape wherein a portion thereof confronting the heat generating element within the shield casing, or a portion thereof confronting a component provided externally of the shield casing protrudes inwardly. According to this, even though the temperature of the housing increases locally, a human body would hardly contact that portion where the temperature has increased, and it is possible to avoid any inconvenience brought about increase of the temperature.

BEST MODE FOR CARRYING OUT THE INVENTION

Embodiment 1

Figure 1:
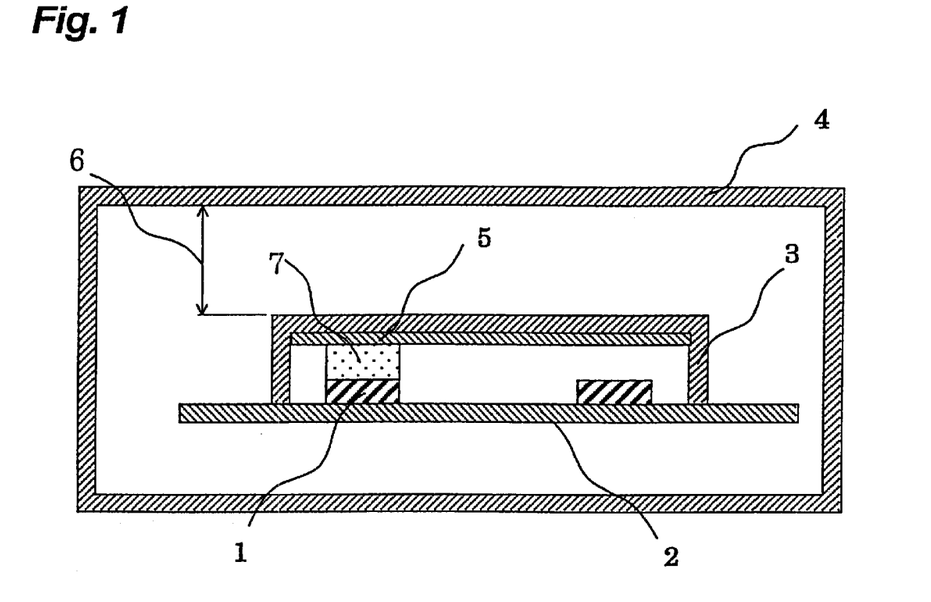
FIG. 1 is a sectioned structural diagram showing an important structure of a mobile communication device according to a first embodiment of the present invention.

FIG. 1 is a sectioned structural diagram showing an important structure of a mobile communication device according to a first embodiment of the present invention. In this figure, reference numeral 1 represents a heat generating element (hereinafter referred to as a pyrogenic element), reference numeral 2 represents a printed substrate on which a communication circuit including the pyrogenic element 1 is mounted, reference numeral 3 represents a resin type shield casing for covering the communication circuit for suppressing incidence of noises from outside that are brought about by electromagnetic waves, and reference numeral 4 represents a housing for accommodating the shield casing 3, the printed substrate 2 and others. Reference numeral 5 represents a heat diffusing sheet (a heat diffusing member) mounted along an inner wall of the shield casing 3 for diffusing heat in a planar direction. As a material for the heat diffusing sheet 5, a metallic lamina of a high thermal conductivity of, for example, aluminum (Thermal conductivity: 236 W/mK) or copper (Thermal conductivity: 403 W/mK), or a graphite sheet of about 0.02 to 0.1 mm in thickness (Thermal conductivity in a planar direction: 800 W/mK. Thermal conductivity in a direction of thickness: 5 W/mK) or the like can be employed. Reference numeral 6 represents a heat insulating layer disposed between the shield casing 3 and an inner wall of the housing 4, which layer is constituted by an air layer (Thermal conductivity: 0.026 W/mK) and a heat insulating material. For the heat insulating material, the use is preferred of a urethane foam (Thermal conductivity: 0.018 to 0.03 W/mK) or the like. Reference numeral 7 represents a heat conductive sheet (a heat conductive member) mounted between the heat diffusing sheet 5 and the pyrogenic element 1 and made of a silicone type material having an electrically insulating property and a thermal conductivity within the range of about 1 to 10 W/mK, for example, a silicone rubber or the like.

Hereinafter, the operation of this embodiment will be described.

When the communication device starts its operation and the pyrogenic element 1 emits heat, the heat from the pyrogenic element 1 radiated from upper and lower sides of the housing 4. This relationship is expressed by the following equation (1):

$$Q=QF+QR \quad (1)$$

wherein Q represents the amount of heat from the pyrogenic element, QF represents the amount of heat radiated from the upper side of the housing, and QR represents the amount of heat radiated from the lower side of the housing.

The radiated heat amounts QF and QR are determined depending on a balance between a thermal resistance RF, from the pyrogenic element to an outside air adjacent the upper side of the housing and a thermal resistance RR from the pyrogenic element to an outside air adjacent the lower side of the housing, respectively, and a relationship between the temperature $\Delta t$ of the pyrogenic element that has been increased and the radiated heat amounts and the thermal resistances is expressed by the following equation (2):

$$\Delta T = QF \times RF = QR \times RR \quad (2)$$

wherein $\Delta T$ represents the temperature of the pyrogenic element increased.

Focusing on a heat radiating path on the upper side of the housing, in the case of the structure shown in FIG. 1, the element temperature increased to a value T that is calculated by the following equation (3):

$$T = T0 + \Delta T1 + \Delta T2 + \Delta T3 + \Delta T4 + \Delta T5 \quad (3)$$

wherein T0 represents the temperature of the outside air; $\Delta T1$ represents a temperature difference brought about by heat transmission by convection of air between the outside air and a housing surface; $\Delta T2$ represents a temperature difference brought about by thermal conduction across the thickness of the housing; $\Delta T3$ represents a temperature difference brought about by thermal conduction between the shield casing and the housing; $\Delta T4$ represents a temperature difference brought about by thermal conduction across the thickness of the shield casing; and $\Delta T5$ represents a temperature difference brought about by thermal conduction across a layer between the pyrogenic element and the shield casing.

The above described temperature differences $\Delta T2$ to $\Delta T5$ can be expressed by the following equation (4) and the temperature difference $\Delta T1$ can be expressed by the following equation (5):

$$\text{Heat Conduction Equation: } \Delta T = (L/\lambda S)QF \quad (4)$$

wherein:

L/λS: Thermal Resistance
Q: Heat Amount
S: Heat Conducting Surface Area
L: Distance
λ: Thermal Conductivity $$\text{Heat Transfer Equation: } \Delta T = (1/hS)QF \quad (5)$$

1/hS: Thermal Resistance
Q: Heat Amount
S: Heat Conducting Surface Area
h: Heat Transfer Coefficient From the equations (4) and (5), it will readily be seen that in order to lower the element temperature (to minimize the temperature difference), the heat conducting surface area should be large, the thermal conductivity (the heat transfer coefficient) should be high and the distance should be small.

In this Embodiment 1, the layer between the pyrogenic element 1 and the shield casing 3 is filled up by the material of a high thermal conductivity (normally 1 to 10 W/mK) to thereby lower the temperature of the pyrogenic element 1. In other words, of laminated component parts confronting the pyrogenic element 1, the layer which tends to have the largest temperature difference per unitary length is the layer between the pyrogenic element 1 and the shield casing 3 where no heat is diffused. Accordingly, even though the heat conductive sheet 7 of a small volume is inserted, a high cooling effect can be obtained and the element temperature can be efficiently lowered.

Also, in this Embodiment 1, the heat diffusing sheet 5 is mounted on an inner wall of the shield casing 3. With the heat diffusing sheet 5 so mounted, the heat diffuses in a planar direction of the heat diffusing sheet 5 with the consequence that the heat conducting surface area is increased. As a result, as can readily be understood from the equations (4) and (5), there is such an effect that the temperature difference occurring in component parts after the heat diffusing sheet 5 can be minimized. In other words, with the heat diffusing sheet 5 mounted on the inner wall of the shield casing 3, heat can be diffused at a location as close to the pyrogenic element 1 as possible and be hence equalized, resulting in minimization of the temperature difference ($\Delta T1 \sim \Delta T4$) from the heat diffusing sheet 5 to the outside air to thereby enable the element temperature to be lowered.

Furthermore, the temperature of the housing 4 immediately below an element on a side adjacent the sheet mounted site is determined depending on such an effect (A) that the amount of heat increases since the amount of heat flowing on a surface of the housing 4 opposite to the sheet mounted site as a result of reduction of the thermal resistance in a direction perpendicular to the sheet surface that is brought about by the mounting of the heat diffusing sheet 5 flows towards the sheet mounted site and such an effect (B) that the temperature difference becomes small as a result of expansion of the heat conducting surface area. Accordingly, if setting is made so that the effect (B) is larger than the effect (A), the housing surface temperature immediately below the element can be lowered as well.

Yet, in this Embodiment 1, since the heat insulating layer (the air layer in FIG. 1) 6 is provided between the shield casing 3 and the inner wall of the housing 4, heat can hardly conduct to the housing 4 and, therefore, there is an effect that the housing temperature is difficult to increase.

As discussed above, the present embodiment has such an effect that by the mounting of a small volume of the light-weight heat diffusing sheet 5 and the heat conductive sheet 7, not only is it possible to prevent from the temperature of the housing from becoming locally high, but also the temperature of the pyrogenic element can be efficiently lowered.

It is to be noted that although in this embodiment the heat diffusing sheet 5 provided on the inner wall of the shield casing 3 has been constituted by a single sheet, the sheet may be divided in a plurality of numbers.

Embodiment 2

Figure 2:
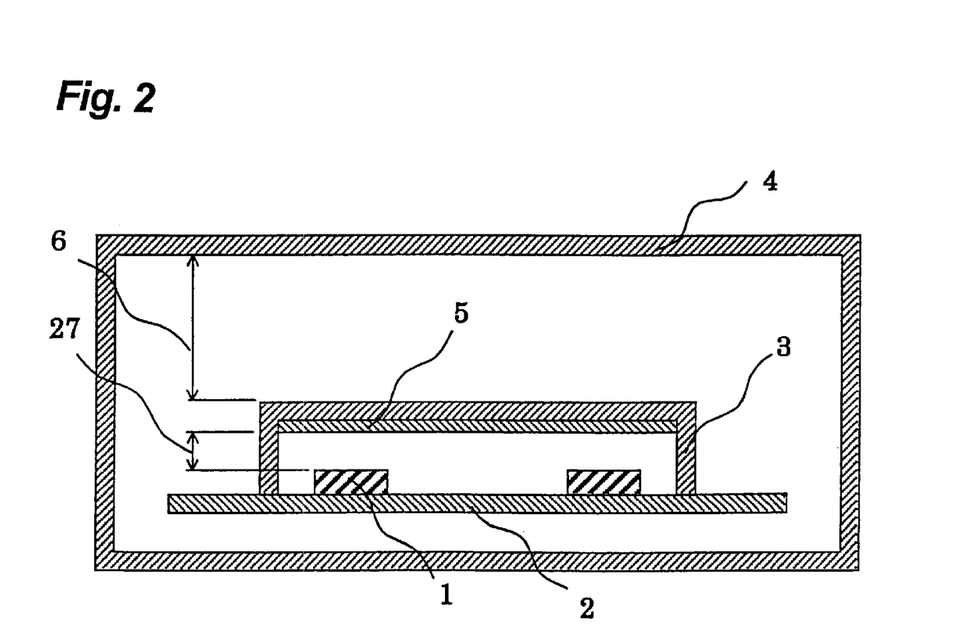
FIG. 2 is a sectioned structural diagram showing an important structure of a mobile communication device according to a second embodiment of the present invention.
Figure 3:
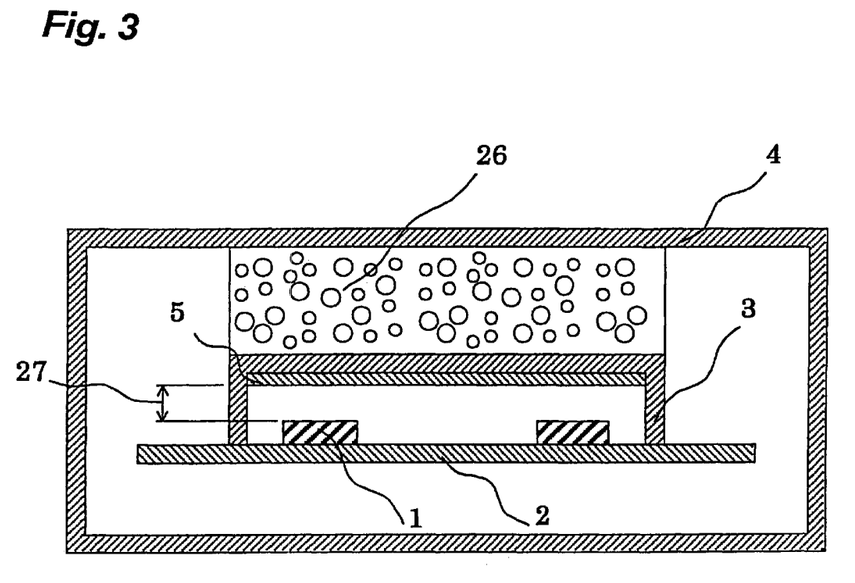
FIG. 3 is a sectioned structural diagram showing an important structure of another mobile communication device according to the second embodiment of the present invention.

FIG. 2 is a sectioned structural diagram showing an important structure of a mobile communication device according to a second embodiment of the present invention and FIG. 3 is a sectioned structural diagram showing an important structure of a different mobile communication device according to the second embodiment of the present invention, wherein FIG. 2 is the example in which an air layer is secured for the heat insulating layer 6 whereas FIG. 3 is the example in which a foamed material 26 is used for the heat insulating layer 6.

In FIGS. 2 and 3, reference numeral 27 represents an air layer. In this Example 2, no heat conductive sheet 7 is employed between the heat diffusing sheet 5 and the pyrogenic element 1, and the air layer exists between the heat diffusing sheet 5 and the pyrogenic element 1. Where the heat amount of the pyrogenic element 1 is small, the element temperature can be sufficiently rendered to be a value not higher than a tolerated temperature, generally by mounting the heat diffusing sheet 5 on the inner wall of the shield casing 2.

As discussed above, merely by mounting a small volume of the light-weight heat diffusing sheet 5, the present embodiment has such an effect that not only is it possible to prevent from the temperature of the housing from becoming locally high, but also the temperature of the pyrogenic element can be efficiently lowered and, also, the number of heat radiating component parts can be reduced, resulting in reduction of both the cost and the weight.

Embodiment 3

Figure 4:
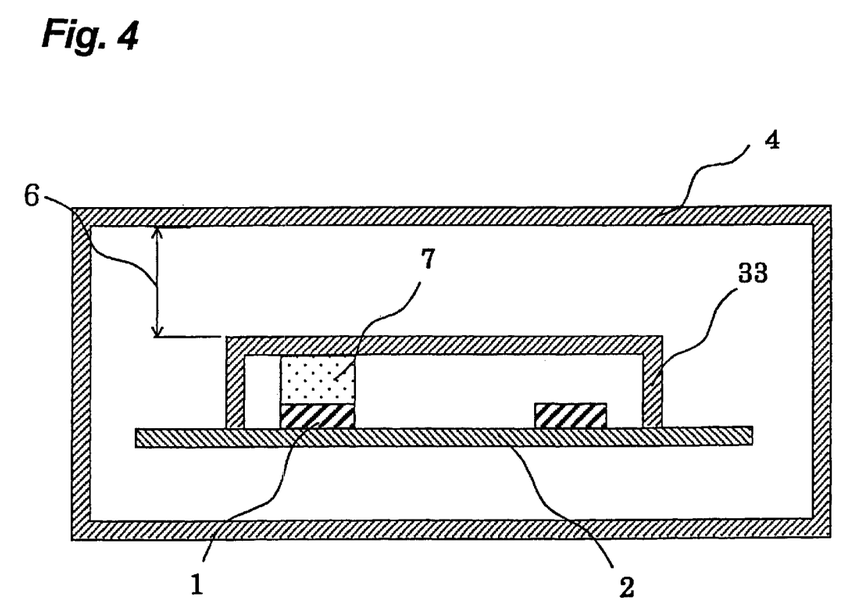
FIG. 4 is a sectioned structural diagram showing an important structure of a mobile communication device according to a third embodiment of the present invention.

FIG. 4 is a sectioned structural diagram showing an important structure of a mobile communication device according to a third embodiment of the present invention. In this figure, reference numeral 33 represents a metallic shield casing. In this embodiment, the shield casing is made of a metallic material, and the function of the heat diffusing sheet 5 in the Embodiment 1 is transferred to this metallic shield casing 33. The heat conductive sheet 7 is mounted between the pyrogenic element 1 and the inner wall of the metallic shield casing, and a space between the metallic shield casing 33 and the housing 4 is occupied by the air layer 6.

By this design, not only can effects similar to those exhibited by the Embodiment 1, but also the mounting of the heat diffusing sheet can be eliminated, and therefore, there is such an effect that the assembling cost can be reduced.

Embodiment 4

Figure 5:
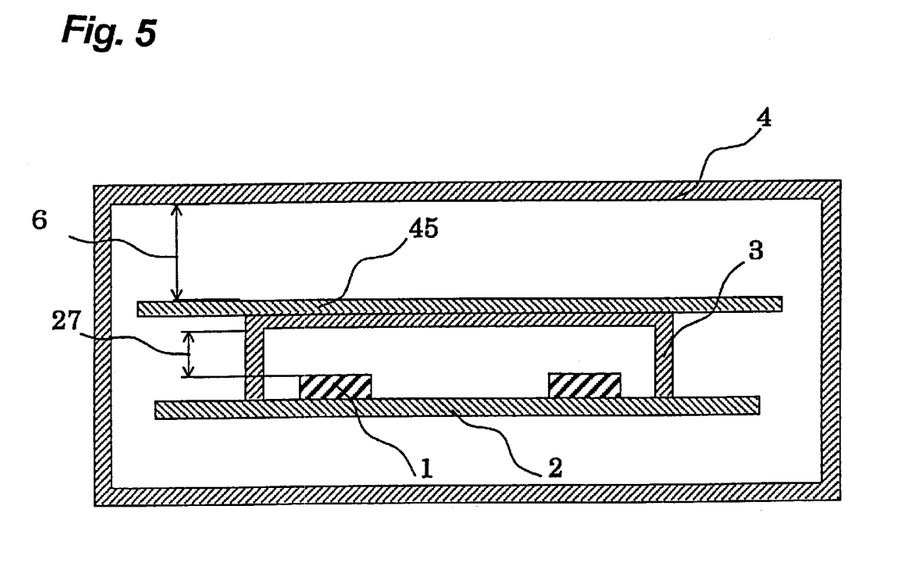
FIG. 5 is a sectioned structural diagram showing an important structure of a mobile communication device according to a fourth embodiment of the present invention.

FIG. 5 is a sectioned structural diagram showing an important structure of a mobile communication device according to a fourth embodiment of the present invention. In this figure, reference numeral 45 represents a heat diffusing sheet mounted on an outer wall of the shield casing 3. A space between the pyrogenic element 1 and the shield casing 3 is occupied by an air layer 27, and a heat insulating layer (an air layer) exits between the heat diffusing sheet 45 and the housing 4.

Where there is a rib or similar projection within the shield casing 3, it may occur that the area of mounting of the heat diffusing sheet is divided into small segments and the assemblability and the workability of the sheet would be deteriorate, resulting in increase of the cost. To resolve these problems, if the heat diffusing sheet 45 is provided on the outer wall of the shield casing 3, the diffusing surface that is so large as to avoid interference with other component parts can be secured, and there is such an effect that since there is no possibility of the sheet being divided into small segments, the processing cost can be reduced.

Also, if within the limit that it will not interfere with other component parts the heat diffusing sheet 45 of a surface area equal to the shield casing or larger than the shield casing as shown in FIG. 5 is mounted on the outer wall of the shield casing 3, there is such an effect that the heat conducting surface area of the housing surface is increased and particularly the housing temperature can be lowered.

It is to be noted that with respect to the temperature lowering effect of the pyrogenic element, the effect is high if it is mounted on the inner wall of the shield casing 3 where the same mounting surface area remains the same.

Embodiment 5

Figure 6:
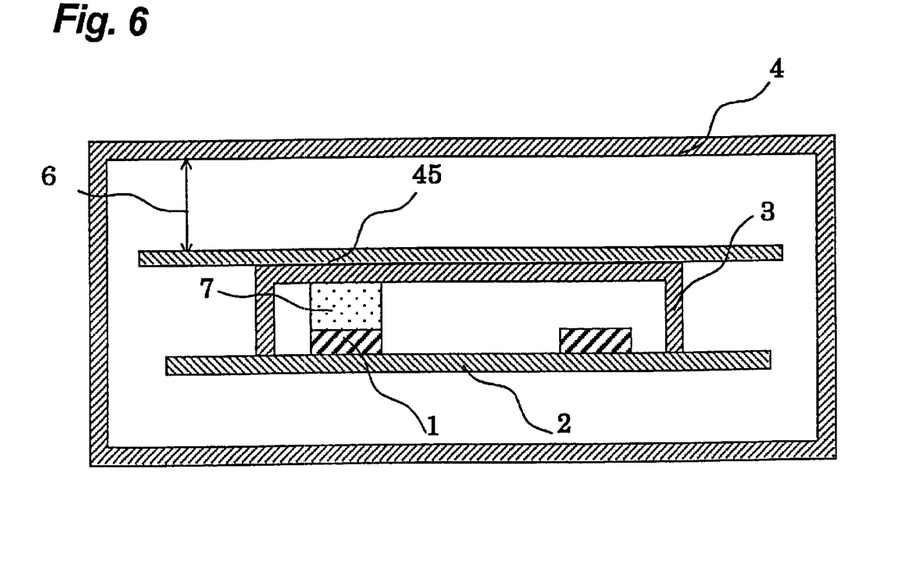
FIG. 6 is a sectioned structural diagram showing an important structure of a mobile communication device according to a fifth embodiment of the present invention.

FIG. 6 is a sectioned structural diagram showing an important structure of a mobile communication device according to a fifth embodiment of the present invention, wherein in the Embodiment 4 in which the heat diffusing sheet 45 is mounted on the outer wall of the shield casing 3, a heat conductive sheet 7 is provided between the pyrogenic element 1 and the inner wall of the shield casing 3. A space between the heat diffusing sheet 45 and the housing 4 is occupied by a heat insulating layer (an air layer) 6.

By this design, even though the heat conductive sheet 7 of a small volume is inserted, a high cooling effect can be obtained and, therefore, not only can the element temperature be lowered efficiently, but the housing temperature can also be efficiently lowered.

Embodiment 6

Figure 7:
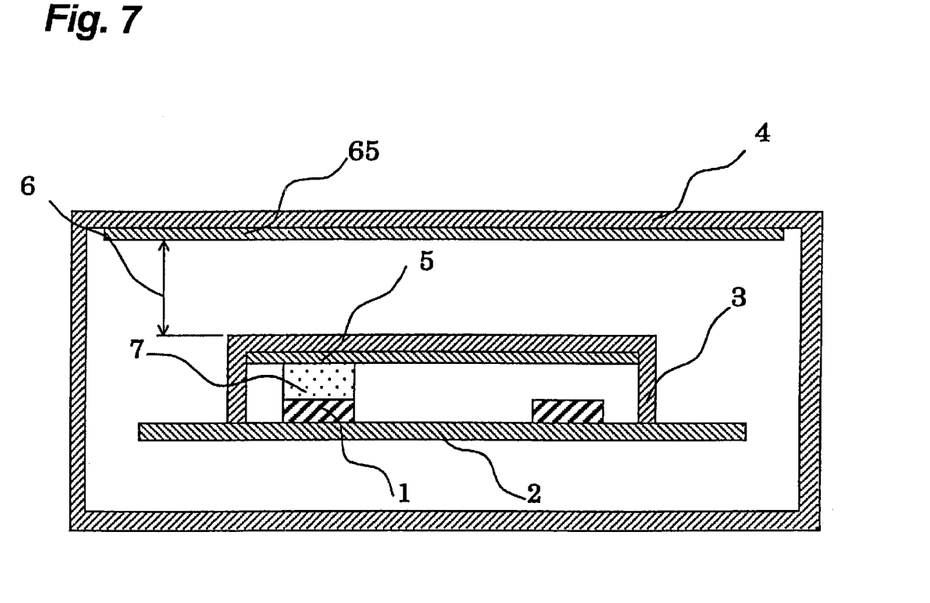
FIG. 7 is a sectioned structural diagram showing an important structure of a mobile communication device according to a sixth embodiment of the present invention.

FIG. 7 is a sectioned structural diagram showing an important structure of a mobile communication device according to a sixth embodiment of the present invention, wherein in the Embodiment 1 a heat diffusing sheet 65 for diffusing heat in a planar direction along the inner wall of the housing 4 is additionally mounted.

Even though a heat insulating layer such as an air layer 6 is provided between the shield casing 3 and the housing 4 to avoid transmission of heat to the housing 4, it may occur that the housing 4 will be locally heated. However, in this embodiment, since the heat diffusing sheet 65 of metal or carbon type is mounted to diffuse the heat, the housing 4 will not be locally heated and the housing temperature can be lowered.

It is to be noted that although in this embodiment the heat diffusing sheet 65 is mounted on the inner wall of the housing 4, it may be mounted on an outer wall of the housing 4. Where it is provided on the outer wall, it may concurrent serve as a seal bearing a product number described thereon.

Also, by forming an inner antenna in the form of a sheet and subsequently mounting it on the housing inner wall, it may be concurrently used as a heat radiating component.

Embodiment 7

Figure 8:
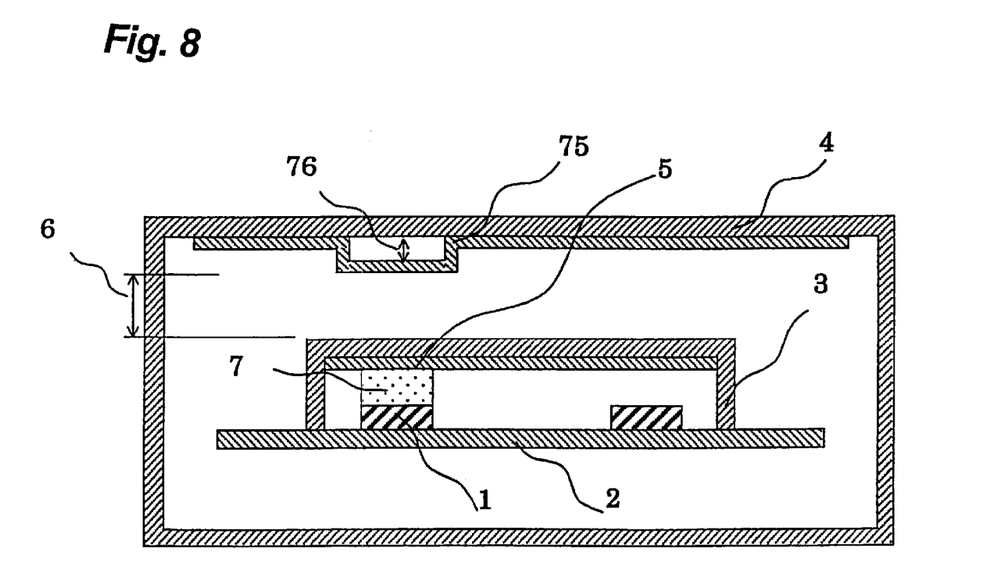
FIG. 8 is a sectioned structural diagram showing an important structure of a mobile communication device according to a seventh embodiment of the present invention.

FIG. 8 is a sectioned structural diagram showing an important structure of a mobile communication device according to a seventh embodiment of the present invention, wherein in the Embodiment 6, a heat diffusing sheet 75 provided on the inner wall of the housing 4 is so shaped that a portion thereof confronting the pyrogenic element 1 within the shield casing 3 protrudes towards the shield casing 3. A space between a projection and the housing 4 is occupied by an air layer 76.

As discussed in connection with the Embodiment 6, even though a heat insulating layer such as the air layer 6 is provided between the shield casing 3 and the housing 4 to avoid transmission of heat to the housing 4, it may occur that the housing 4 will be locally heated, but since in this Embodiment 7, the heat diffusing sheet 75 having the air layer 76 is provided on the housing inner wall to diffuse heat to the housing surface other than a region thereof immediately below the pyrogenic element, there is an effect that the housing will not be heated locally.

Embodiment 8

Figure 9:
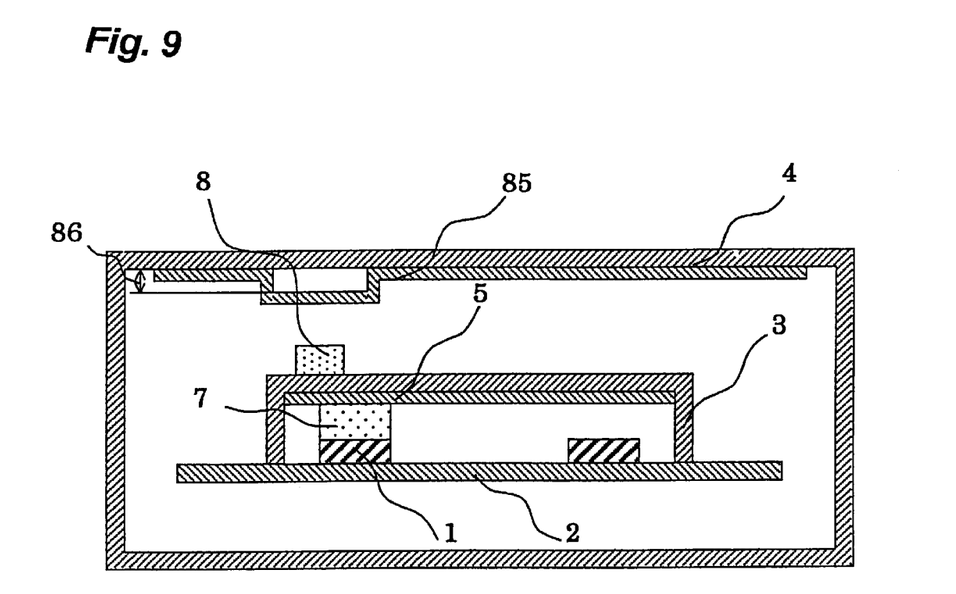
FIG. 9 is a sectioned structural diagram showing an important structure of a mobile communication device according to an eighth embodiment of the present invention.

FIG. 9 is a sectioned structural diagram showing an important structure of a mobile communication device according to an eighth embodiment of the present invention. In this figure, reference numeral 85 represents a heat diffusing sheet provided on an inner wall of the housing 4, reference numeral 86 represents an air layer, and reference numeral 8 represents a device component part provided outside the shield casing 3.

Where the device component part 8 exists unevenly between the shield casing 3 and the housing 4, even though the temperature is equalized by the heat diffusing sheet 5 mounted on the inner wall of the shield casing 3, unevenness of a thermal resistance is caused by the device component 8 between the shield casing 3 and the housing 4. As a result thereof, heat flows in a large quantity to the device component 8 which has a low thermal resistance, resulting in increase of the temperature of the housing 4 immediately below the device component 8. This embodiment can accommodate this and, as is the case with the Embodiment 7, the heat diffusing sheet 85 provided on the inner wall of the housing 4 is so shaped that a portion thereof confronting the component 8 provided outside the shield casing 3 protrudes towards the shield casing 3. A space between a projection and the housing 4 is occupied by an air layer 86.

In this way, the heat flowing towards immediately below the device component can be diffused to the housing surface other than an area immediately below the component and, therefore, there is an effect that the housing will not be heated locally.

Embodiment 9

Figure 10:
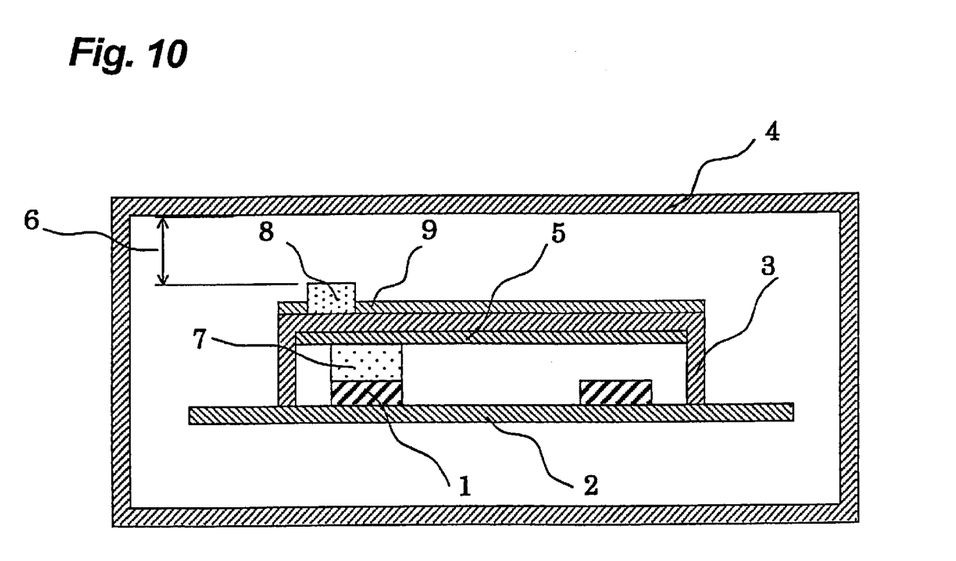
FIG. 10 is a sectioned structural diagram showing an important structure of a mobile communication device according to a ninth embodiment of the present invention.

FIG. 10 is a sectioned structural diagram showing an important structure of a mobile communication device according to a ninth embodiment of the present invention, which as is the case with Embodiment 8, can accommodate the uneven existence of the device component 8 between the shield casing 3 and the housing 4 which would otherwise result in unevenness of the thermal resistance and consequent increase of the temperature of the housing 4 immediately below the device component 8. In this figure, reference numeral 9 represents a heat equalizing member that is provided on an area of the outer wall of the shield casing 3 other than the area where the device component 8 is mounted. As a material for the heat equalizing member 9, the use is recommend of a kind effective to render the thermal resistance of a heat transmission path from the shield casing 3 to the housing 4 via the device component 8 to be equal or substantially equal to that of a heat transmission path from the shield casing 3 to the housing 4 via the heat equalizing member 9.

By this design, since the thermal resistance from the shield casing 3 to the housing 4 is equalized, there is an effect that the housing will not be heated locally.

Figure 11:
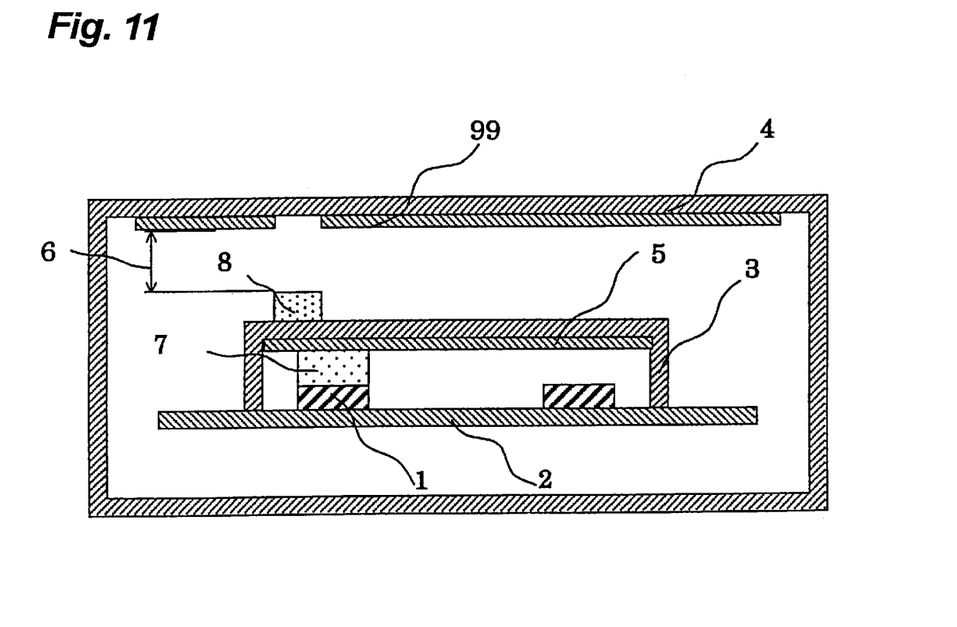
FIG. 11 is a sectioned structural diagram showing an important structure of another mobile communication device according to the ninth embodiment of the present invention.

It is to be noted that although in FIG. 10 the heat equalizing member 9 is fitted to the outer wall of the shield casing 3, the heat equalizing member 99 may be fitted to an area of the inner wall of the housing 4 other than the area confronting the device component 8. FIG. 11 illustrates such arrangement.

Embodiment 10

Figure 12:
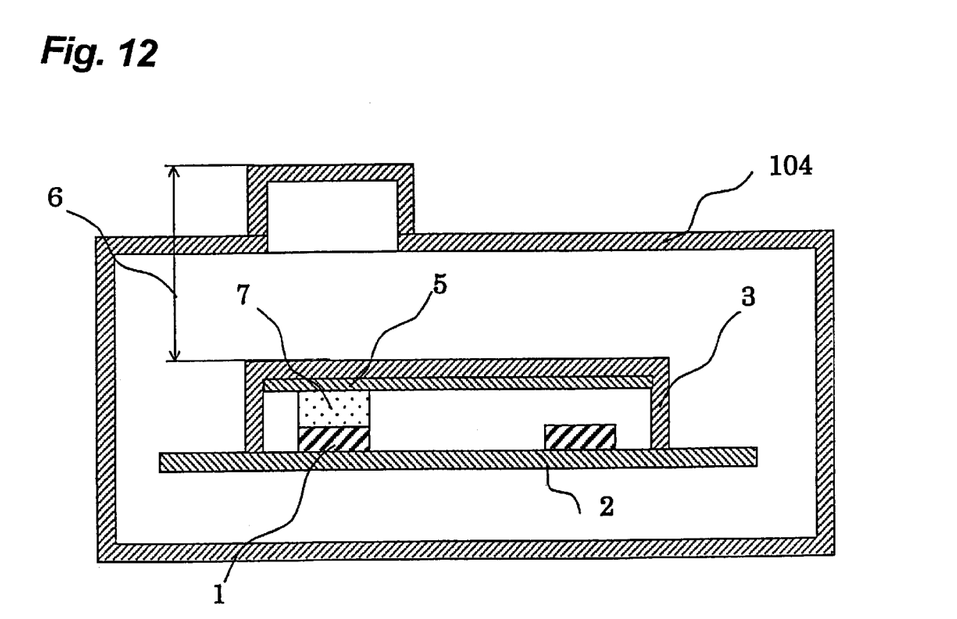
FIG. 12 is a sectioned structural diagram showing an important structure of a mobile communication device according to a tenth embodiment of the present invention.

FIG. 12 is a sectioned structural diagram showing an important structure of a mobile communication device according to a tenth embodiment of the present invention. In this figure, reference numeral 104 represents a housing having the surface immediately below the pyrogenic element 1 that is so shaped as to protrude outwardly. Others are of a structure similar to those in Embodiment 1.

By so doing, in the Embodiment 1, even in the case in which the housing temperature immediately below the pyrogenic element 1 becomes high, the air layer 6 between the shield casing 3 and the housing 4 has a thickness that is large immediately below the element to provide an increased thermal resistance and, therefore, the housing surface temperature will not be heated locally.

Embodiment 11

Figure 13:
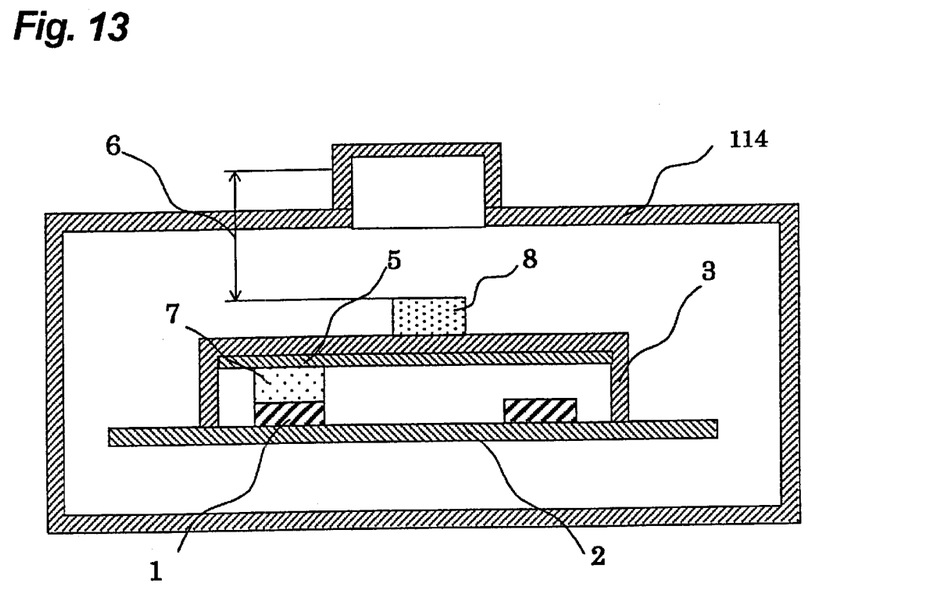
FIG. 13 is a sectioned structural diagram showing an important structure of a mobile communication device according to an eleventh embodiment of the present invention.

FIG. 13 is a sectioned structural diagram showing an important structure of a mobile communication device according to an eleventh embodiment of the present invention. In this figure, reference numeral 114 represents a housing having the surface immediately below the device component 8, provided outside the shield casing 3, which is so shaped as to protrude outwardly.

By so designing, even where as a result of unevenness of the thermal resistance caused by the presence of the device component 8 a large amount of heat flows into the device component 8 having a low thermal resistance and, therefore, the temperature of the housing 4 immediately below the device component 8 is increased, the housing surface temperature will not be heated locally because the air layer 6 between the shield casing 3 and the housing 4 is so thick immediately below the device component as to increase the thermal resistance.

Embodiment 12

Figure 14:
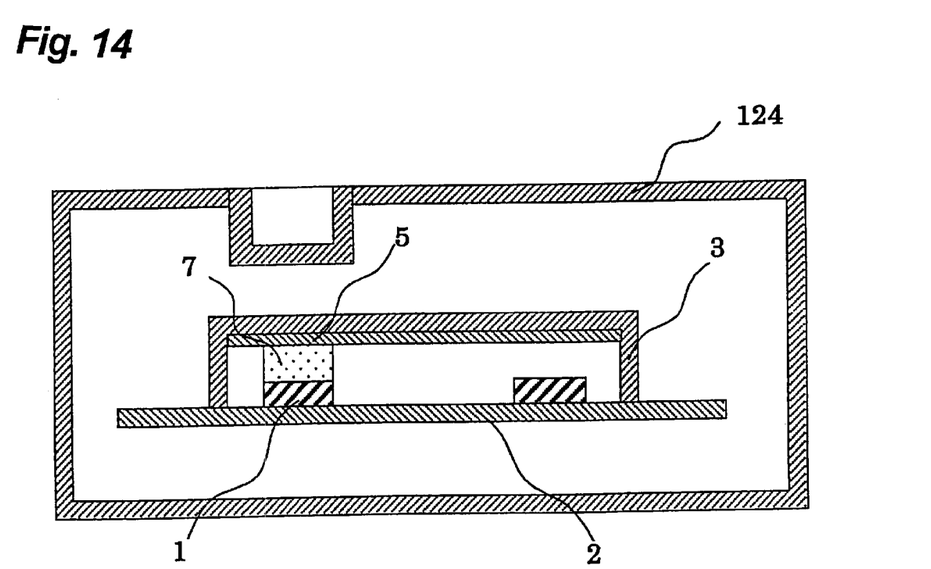
FIG. 14 is a sectioned structural diagram showing an important structure of a mobile communication device according to a twelfth embodiment of the present invention.

FIG. 14 is a sectioned structural diagram showing an important structure of a mobile communication device according to a twelfth embodiment of the present invention. In this figure, reference numeral 124 represents a housing which that portion of the housing which has been so formed as to protrude outwardly in the Embodiment 10 is so formed as to protrude inwardly.

By so designing, even though the temperature of the housing portion immediately below the pyrogenic element 1 increases locally, a human body would hardly contact that portion where the temperature has increased, and it is possible to avoid any inconvenience brought about increase of the temperature.

Embodiment 13

Figure 15:
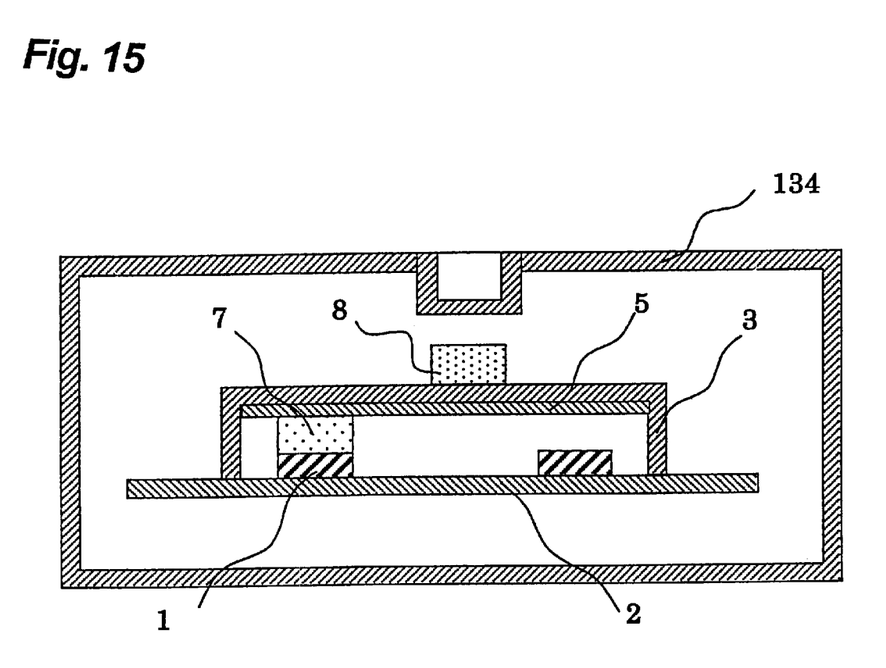
FIG. 15 is a sectioned structural diagram showing an important structure of a mobile communication device according to a thirteenth embodiment of the present invention.

FIG. 15 is a sectioned structural diagram showing an important structure of a mobile communication device according to a thirteenth embodiment of the present invention. In this figure, reference numeral 134 represents a housing which that portion of the housing which has been so formed as to protrude outwardly in the Embodiment 11 is so formed as to protrude inwardly.

By so designing, even though the temperature of the housing portion immediately below the device component 8 increases locally, a human body would hardly contact that portion where the temperature has increased, and it is possible to avoid any inconvenience brought about increase of the temperature.

Figure 16A:
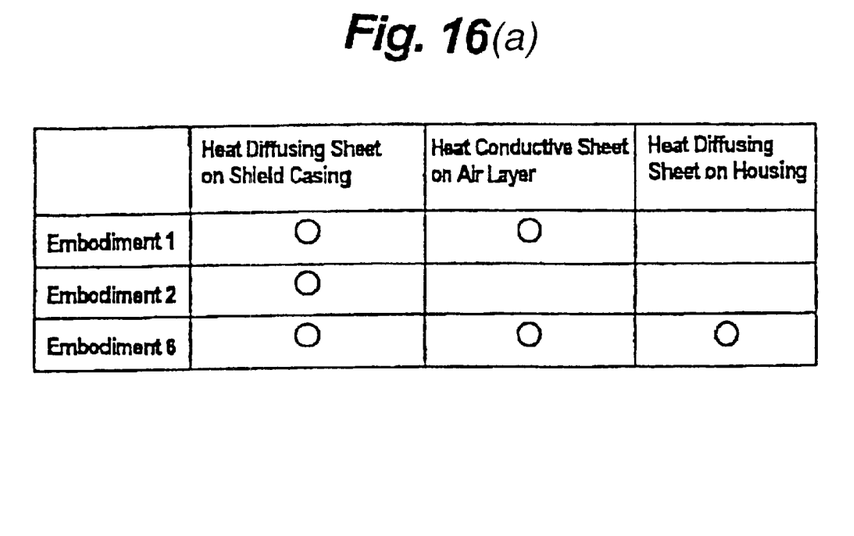
FIGS. 16(a) and 16(b) are a chart and a graph showing comparison of a cooling effect obtained by a heat radiating structure in the mobile communication devices according to the first, second and sixth embodiments.
Figure 16B:
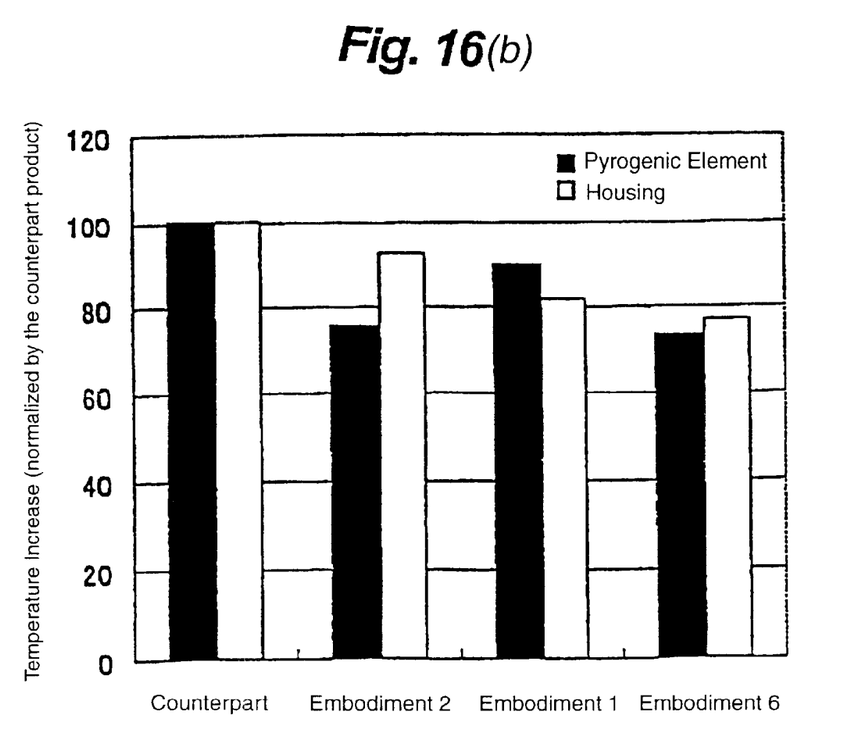

Results of thermal analysis performed with the Embodiments 1, 2 and 6 of the present invention are shown in FIGS. 16(*a*) and 16(*b*).

It is clear that there is a difference in temperature of the pyrogenic element and that in housing temperature between a counterpart product that is not provided with the heat diffusing sheet 5 on the shield casing 3, the heat conductive sheet 7 and the heat diffusing sheet on the housing 4 and any one of the Embodiment 1 (FIG. 1), the Embodiment 2 (FIG. 2) and the Embodiment 6 (FIG. 7).

It is to be noted that although in any one of the above described Embodiments 6 to 13, the structure of the Embodiment 1 has been modified in such a way that the heat diffusing sheet is provided on the inner or outer wall of the housing and/or this heat diffusing sheet is so designed as to partially protrude, and/or the heat equalizing member is provided on the outer wall of the shield casing or the inner wall of the housing, and/or the housing is so shaped as to be partially protruded or recessed, a similar modification as that described may be applied to any one of the Embodiments 2 to 5.

INDUSTRIAL APPLICABILITY

The communication device according to this embodiment does not only to a mobile wireless instrument such as a mobile telephone that is a mobile information terminal, but is also applicable to various communication instruments such as a home-use cordless telephone or the like.

What is claimed is:

1. A communication device comprising:
   a communication circuit mounted on a printed substrate and having a heat generating element;
   a shield casing covering the communication circuit and shielding electromagnetic waves;
   a housing accommodating the printed substrate having the shield casing and the communication circuit mounted on the printed substrate;
   a heat diffusing member mounted along an inner wall of the shield casing for diffusing heat in a planar direction; and
   a heat insulating layer disposed between the shield casing and an inner wall of the housing.

2. The communication device according to claim 1, further comprising an electrically insulating, thermally conductive member disposed between the heat diffusing member and the heat generating element.

3. The communication device according to claim 1, further comprising a heat equalizing member on an outer wall of the shield casing, excluding a location where a component is located externally of the shield casing, or on the inner wall of the housing, excluding an inner wall portion of the housing confronting the component.

4. The communication device according to claim 1, wherein the housing has a shape including a portion confronting the heat generating element within the shield casing, or a portion confronting a component located externally of the shield casing, protruding outwardly.

5. The communication device according to claim 1, wherein the housing has a shape including a portion confronting the heat generating element within the shield casing, or a portion confronting a component located externally of the shield casing, protruding inwardly.

6. The communication device according to claim 1, further comprising a heat diffusing member for diffusing heat in a planar direction, said heat diffusing member being mounted on the inner wall of the housing or an outer wall of the housing.

7. The communication device according to claim 6, wherein the heat diffusing member has a shape with a portion confronting the heat generating element within the shield casing, or a portion confronting a component located externally of the shield casing, protruding towards the shield casing.

* * * * *